US 6,717,886 B2

(12) United States Patent
Pramod et al.

(10) Patent No.: US 6,717,886 B2
(45) Date of Patent: Apr. 6, 2004

(54) CONTROL CIRCUIT FOR AN S-DRAM

(75) Inventors: Acharya Pramod, Munich (DE); Stefan Dietrich, Türkenfeld (DE); Sabine Kieser, Hausham (DE); Peter Schroegmeier, Munich (DE); Christian Weis, Germering (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/248,874

(22) Filed: Feb. 26, 2003

(65) Prior Publication Data

US 2003/0161210 A1 Aug. 28, 2003

(30) Foreign Application Priority Data

Feb. 28, 2002 (DE) .......................................... 102 08 716

(51) Int. Cl.$^7$ ................................................. G11C 8/00
(52) U.S. Cl. ....................... 365/233; 365/194; 365/193; 365/230.08; 365/189.12
(58) Field of Search ................................. 365/233, 194, 365/193, 230.08, 189.012

(56) References Cited

U.S. PATENT DOCUMENTS 5,825,710 A * 10/1998 Jeng et al. ............. 365/230.03
5,835,956 A * 11/1998 Park et al. ................... 711/167

* cited by examiner

*Primary Examiner*—Connie C. Yoha
(74) *Attorney, Agent, or Firm*—Moore & Van Allen PLLC; Steven B. Phillips

(57) ABSTRACT

Control circuit for a data path of an S-DRAM which is clocked by a high-frequency clock signal, having a programmable mode register for storing a latency value; a latency generator for temporally delaying a data path control signal, generated by an internal sequence controller, with a switchable latency; a latency decoder, which switches the latency generator in a manner dependent on the latency value stored in the mode register, provision being made of at least one signal delay element, which can be switched in by the latency decoder and serves for the signal delay of the data path control signal with a specific delay time, the latency decoder switching in the associated signal delay element if the stored latency value is high.

31 Claims, 13 Drawing Sheets

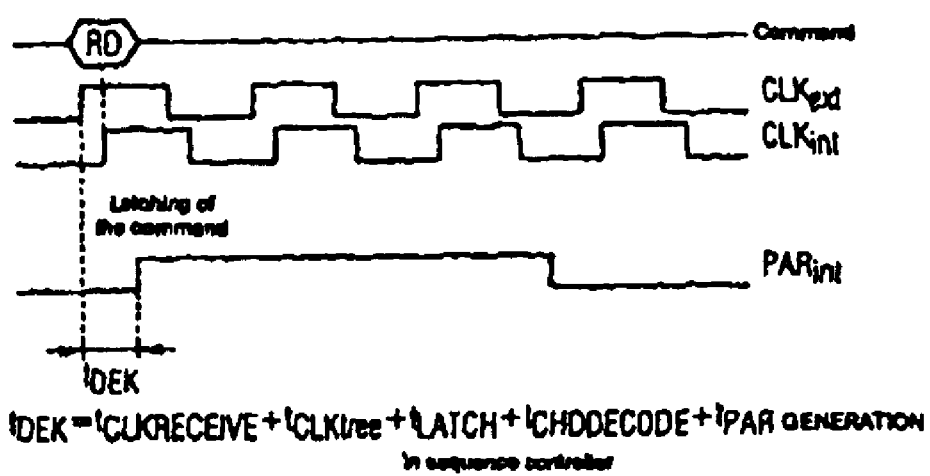
FIG 2 "Prior Art"

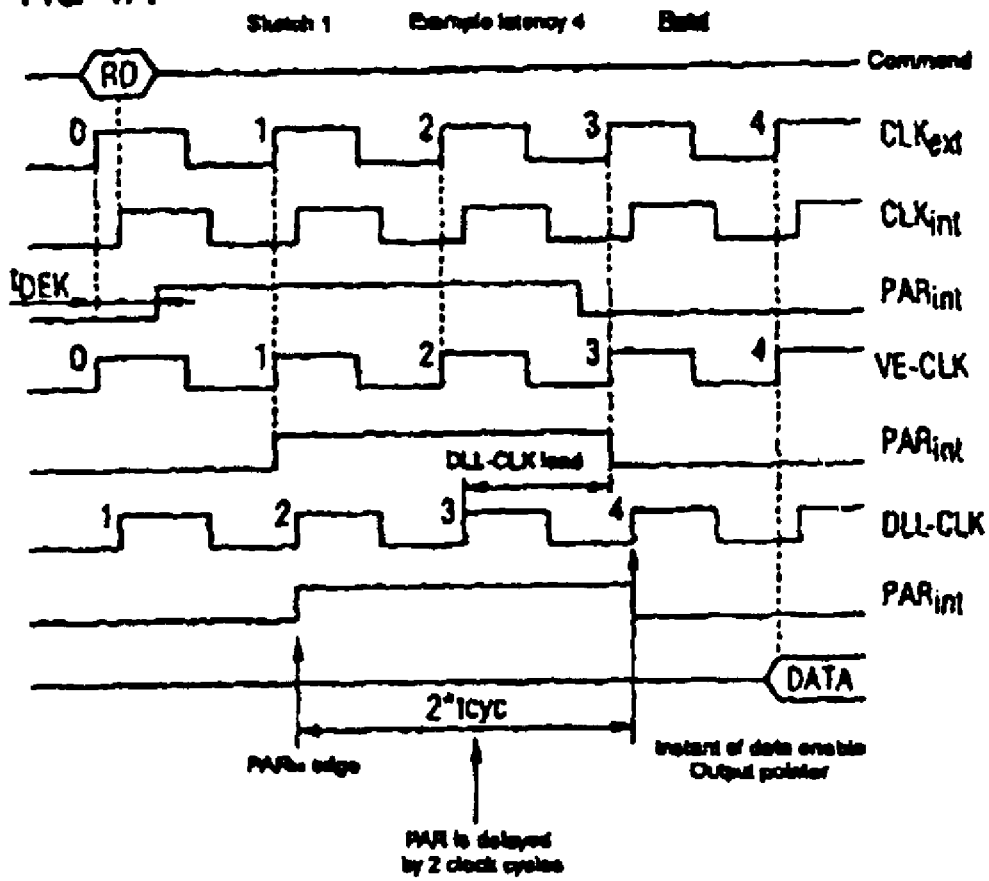

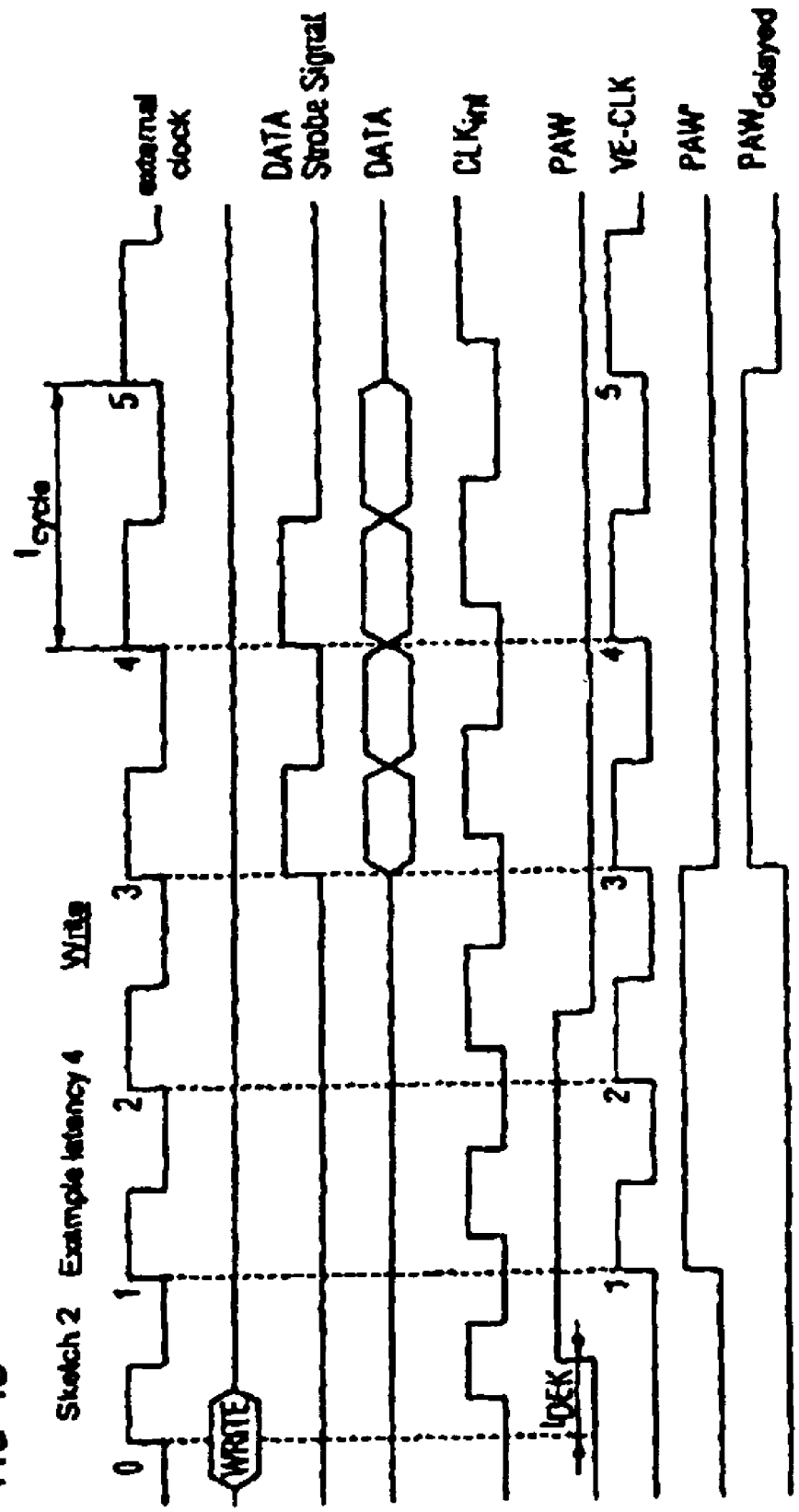

FIG 5  "Prior Art"

| Speed Sort | | -2.2 | -2.5 | -2.8 | Units |
|---|---|---|---|---|---|
| CAS latency=6 | fCK6 min | 2.2 | 2.5 | 2.8 | ns |
|  | fCK6 max | 455 | 400 | 357 | MHz |
| CAS latency=5 | fCK5 min | 2.5 | 2.5 | 2.8 | ns |
|  | fCK5 max | 400 | 400 | 357 | MHz |
| CAS latency=4 | fCK4 min | 3.0 | 3.0 | 3.0 | ns |
|  | fCK4 max | 333 | 333 | 333 | MHz |

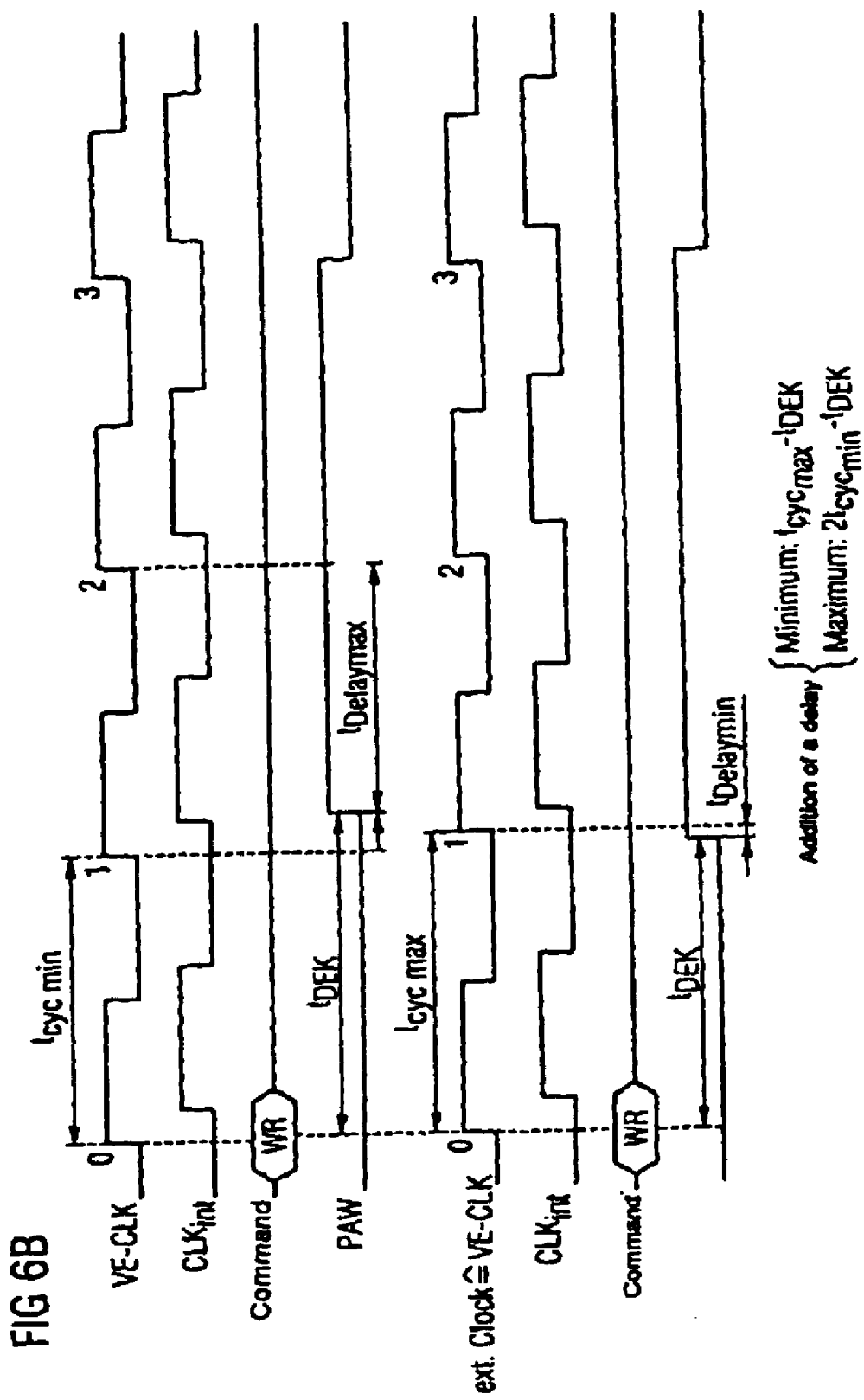

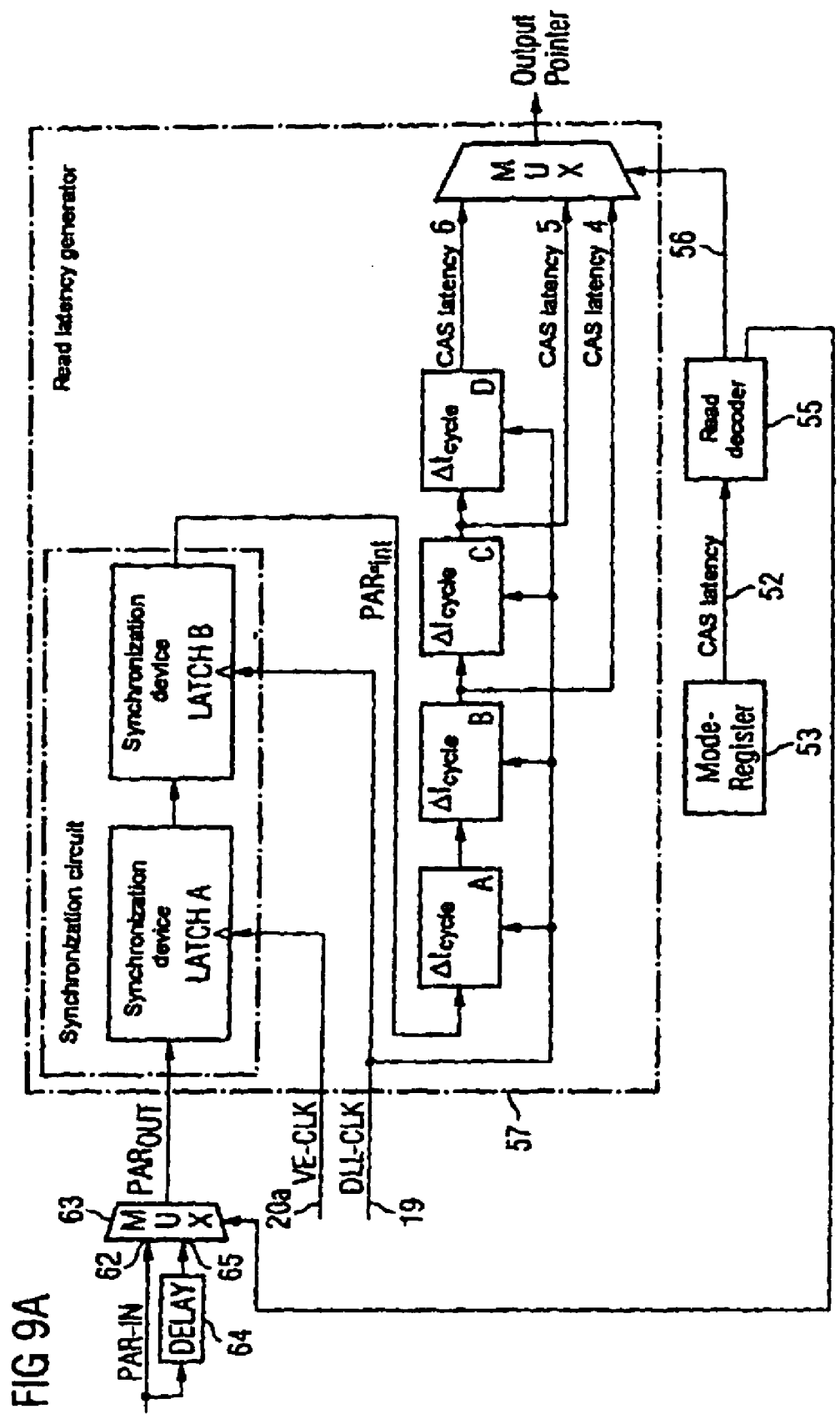

CONTROL CIRCUIT FOR AN S-DRAM

BACKGROUND OF INVENTION

The invention relates to a control circuit for the data path of an S-DRAM. RAM modules are standard memory modules for main memory. D-RAM memories comprise large scale integrated transistors and capacitors. In order to maintain the information, the memory content has to be continually refreshed in this case (refresh). A synchronous D-RAM (S-DRAM) permits the memory access without additional waiting cycles. In this case, the data transfer between the S-DRAM and an external data bus is effected synchronously with the external clock signal.

FIG. 1 shows an S-DRAM memory module according to the prior art. The S-DRAM memory module is connected to an external control bus, to an external address bus and to an external data bus. Via command PADS, the control commands present on the external control bus are read in by an integrated command receiver and the reception signals are applied, after having undergone signal amplification, to a command decoder. The command decoder decodes the applied control commands, which have a width of 4 bits, for example, to form internal control commands, such as, for instance, write (WR) and read (RD). The S-DRAM comprises a state machine or a sequence controller which controls the internal sequences in a manner dependent on the decoded internal control commands. The sequence controller is clocked by a clock signal. For this purpose, an external clock signal $CLK_{ext}$ is applied to the S-DRAM and signal-amplified by an integrated clock signal receiver. The amplified clock signal is distributed by a clock tree in a tree-like manner in the integrated S-DRAM and passes via an internal clock line to a sequence controller. The external clock signal is furthermore applied to a delay locked loop DLL. The delay locked loop DLL effects a negative phase shift of the external clock signal CLK that is present. The internal DLL clock signal leads the external clock signal in order that the data are present synchronously with the external clock signal at the data pads. The output signal driver OCD (off chip driver) of a data path, said output signal driver being integrated in the S-DRAM, is clocked with the DLL clock signal $DLL_{CLK}$. Connected downstream of the delay locked loop DLL is a propagation time element which forms an internal clock signal (VE-CLK) which is simulated identically to the external clock signal, i.e. VE-CLK is completely synchronous with $CLK_{ext}$. The propagation time element in this respect compensates for the negative phase shift of the delay locked loop DLL.

The internal sequence controller generates control signals for the internal operating sequence of the S-DRAM in a manner dependent on the decoded commands. The sequence controller generates an RAS signal (row address strobe) for driving a row address latch and a CAS signal (column address select) for driving a column address latch. The row address latch and the column address latch are connected to an address signal receiver of the S-DRAM via an internal address bus. The S-DRAM receives an external address via the external address bus at the address PADS, the address signals present being signal-amplified by an address receiver. In order to save terminals, the address is input in two steps in DRAM memories. In a first step, the lower address bits are loaded with the RAS signal into the row address latch. In a second step, the more-significant address bits are loaded with the CAS signal into the column address latch. The address bits are applied to a row and column decoder, respectively, for access to a memory cell within the matrix-type memory cell array. The row address latch and the column address latch and also the row decoder and column decoder together form an address signal decoder. For the refresh of the memory cells, the memory cell array receives a refresh control signal from the sequence controller. A refresh counter, which receives an enable signal from the sequence controller, successively generates all existing row addresses, which are then applied to the address bus. The sequence controller generates an RAS control signal for this purpose. Through the activation of a word line, all the memory cells connected to it are refreshed.

The memory cell array is furthermore connected to read/write amplifiers. The number of read/write amplifiers depends on the memory architecture, the word width and the prefetch. Given prefetch 4 with a word width of 32, by way of example, 128 read/write amplifiers are in operation simultaneously. If four independent memory banks are provided, for example, a total of 512 read/write amplifiers are integrated on the memory chip.

Via the read/write amplifiers, a data bit is in each case written to an addressed memory cell or read from it. The read/write amplifiers are connected to an internal data path of the S-DRAM via an internal data bus. Via the data path, the data present in the external data bus are written to the S-DRAM synchronously and output from the S-DRAM synchronously. The data path is connected to the data PADS of the S-DRAM.

For reading in the data, the data path acquires a data receiver for receiving the data that are present externally. An internal driver circuit for the data to be written (WR driver) carries out a signal amplification of the received data and outputs the read-in data to the read/write amplifiers via the internal bus. The driver circuit WR driver is driven by a write latency generator which is clocked by the internal clock signal VE-CLK. For its part, the write latency generator is connected to a decoder.

For synchronous outputting of data, the data path contains a data FIFO register, downstream of which an output data driver circuit (OCD driver) is connected. The FIFO register is driven by the read/write amplifier by means of an input pointer and by a read latency generator by means of an output pointer or a time-delayed data enable signal. The read latency generator is likewise connected to a decoder.

The two decoders for the read latency generator and the write latency generator are connected via internal control lines to a mode register in which the data for controlling the operating modes within the S-DRAM are stored. The mode register can be initialized by a mode register set command via the internal address bus. The mode register is initialized after the switch-on. Before external control commands are applied to the S-DRAM, the mode register is initialized. The mode register contains control data for the CAS latency, for test modes and for a DLL reset.

The sequence controller generates, in a manner dependent on the external control commands, an internal write command PAW for activating the write latency generator and an internal read command PAR for activating the read latency generator.

FIG. 2 shows a timing diagram for elucidating the method of operation of a conventional S-DRAM. An external clock signal CLK-external is present at the S-DRAM. The state machine or sequence controller generates an internal command signal in a manner dependent on the decoded read command RD. The read command is applied relative to a rising signal edge of the external clock signal $CLK_{ext}$. The clock signal is received and distributed. With the internal clock signal $CLK_{int}$, the command is accepted and subsequently decoded. The sequence controller generates an internal read command control signal $PAR_{int}$, for example.

The internal control signal $PAR_{int}$ is generated with a certain signal delay, namely an out-decoding time $\Delta t_{DEK}$. This out-decoding time comprises a signal delay on account of the clock signal receiver, on account of the clock signal line tree (clock tree) and on account of signal delays within the sequence controller.

$$t_{DEK}=t_{CLK_{RECEIVER}}+t_{CLK_{TREE}}+t_{Latch}+t_{CMD_{Decode}}+t_{PAR_{GENERATION}}$$

The generated internal read signal $PAR_{int}$ is applied to the read/write amplifiers with a short signal delay and said amplifiers output the data to be read out to the internal data bus. With a further time delay $\Delta t_{FIFO}$ the data pass from the internal data bus via the FIFO register within the data path to the input of the OCD driver. The OCD driver or data output driver outputs the data to the data PADS of the S-DRAM with a further signal delay $\Delta t_{OCD}$. Between the edge of the external clock signal upon which the decoded internal read command RD is applied and the outputting of data via the data PADS, there is a delay time $\Delta T$.

FIG. 3a shows a read latency generator and FIG. 3b shows a write latency generator according to the prior art.

As can be discerned from FIG. 3a, in order to achieve a read latency or CAS latency of CAS=6, the synchronized internal read signal $PAR''_{int}$ is applied to the chain of timing elements within the read latency generator and delayed with a delay time corresponding to four times the clock cycle time $\Delta t_{cycle}$. In order to achieve a CAS latency of 5, the synchronized internal read signal merely passes through 3 timing elements, and in order to achieve a CAS latency of 4, the synchronized internal read signal merely passes through 2 timing elements. Accordingly, on an internal multiplexer of the read latency generator, three inputs are provided which are connected to outputs of timing elements within the chain. The decoder decodes the desired CAS latency stored in digital form in the mode register and drives the multiplexer via a control line. If a CAS latency of 4, for example, is stored in the mode register, the decoder switches through the third input of the multiplexer to the output control line. On the output side, the multiplexer is connected to the FIFO register and outputs a time-delayed enable signal to the FIFO register.

FIG. 4a shows a timing diagram for elucidating the function of a read latency generator or latency counter according to the prior art as is illustrated in FIG. 3a. The example illustrated in FIG. 4a shows the sequence given a stored CAS latency of 4. The decoder identifies the CAS latency of 4 and switches over the multiplexer, so that a time delay is effected by two clocked timing elements. Since the timing elements in the read latency generator are clocked by the internal clock signal DLL-CLK, a time-delayed data enabling is effected after the third rising edge of the DLL-CLK clock signal.

However, the internal read command signal applied to the read latency generator passes to the latency generator only in a time-delayed manner with a time delay $\Delta t_{DEK}$. As the clock frequency of the external clock signal increases, the cycle time $t_{cycle}$ of the clock signal decreases. At a clock rate of 500 MHz, the cycle time $t_{cycle}$ only 2 ns and is in the region of signal propagation times on the chip. Since the time delay $\Delta t_{DEK}$ is constant, the situation arises, in the case of a clock signal at a very high frequency, in which the signal time delay $\Delta t_{DEK}$ becomes greater than the cycle time $t_{cycle}$. In this case, the synchronization of the internal read signal $PAR_{int}$ to $PAR_{int}'$ takes place incorrectly one clock edge of the VECLK clock too late, that is to say with the VECLK edge 2 instead of with the VECLK edge.

A second error mechanism independent thereof relates to the offset between the VECLK and the DLLCLK. If the propagation time of the OCD and the propagation time of the FIFO become greater than $t_{cycle}$, the temporal offset between VELCK [sic] and DLLCLK also becomes greater than $1t_{cycle}$.

In this case, the synchronization of the internal read signal $PAR'_{int}$ to $PAR''_{int}$ takes place incorrectly one clock edge of the DLL clock signal DLL-CLK later, i.e. with the signal edge 2, instead of correctly with the signal edge 1.

Consequently, as soon as one of the two error mechanisms just described occurs, the read latency counter according to the prior art in accordance with FIG. 3a switches a very high-frequency clock signal that is present one counting clock too late and the S-DRAM outputs the data incorrectly too late. This in turn leads to considerable malfunctions of the whole system, in particular of the microprocessor connected to the S-DRAM.

FIG. 3b shows the write latency generator according to the prior art which is contained in the data path of the conventional S-DRAM. The conventional write latency generator illustrated in FIG. 3b receives an internal data path control signal (PAW) from the sequence controller. A synchronization circuit, which merely comprises a synchronization latch A, synchronizes the internal data path control signal to the VE clock signal. Said clock signal VE-CLK is completely synchronous with the external clock signal CLK-external. The internal data path control signal synchronized in this way is applied to a chain of series-connected time switching elements which each cause a time delay of one clock cycle. The time switching elements are clocked by the clock signal VE-CLK. Each of the time switching elements effects a signal time delay which is identical to the cycle time of the $\Delta t_{cycle}$ of the external clock signal.

In the case of the write latency generator according to the prior art as illustrated in FIG. 3b, the CAS latency is stored in the mode register, in which case, by way of example, a CAS latency of 6, a CAS latency of 5 and a CAS latency of 4 can be stored in the mode register. There are also memories with other latencies, such as, for instance, 2, 3 or 7.

The read latency or CAS latency specifies a number of clock cycles between the application of the external read command and the appearance of the output data at the OCD driver. Read latency CAS is understood to be the number of clock cycles which elapses before, after the application of a read command to a synchronous memory, the requested data appear at the output of the memory. A low read latency CAS has the advantage that a connected controller requires fewer waiting cycles. Depending on the length of internal signal propagation times, decoding times, amplifier propagation times on the memory chip, a low read latency CAS can be achieved, or higher read latencies have to be accepted. An important influencing factor in this case is the quality of the production process. However, these process fluctuations not only determine the read latencies CAS of the memory chip, but are also a main influencing factor for the ability of the memory chip to achieve high clock rates.

Write latency is understood to be the number of clock cycles which elapses between the application of a write command and the application of the data at the inputs of the memory chip. In conventional S-DRAMs, the read latency CAS can be programmed into a mode register. In the DDR2 standard, the write latency is coupled to the read latency CAS and amounts to one clock cycle fewer than the read latency.

Write latency=read latency−1.

As can be discerned from FIG. 3b, a CAS latency of 4 corresponds to a write latency of 3 and a time delay of $2\Delta t_{cycle}$ by two timing elements of the write latency generator.

FIG. 4b shows a write operation in an S-DRAM given a stored CAS latency of 4. During the clock cycle 0 of the external clock signal, a write command WRITE is applied and decoded. The sequence controller generates an internal timing control signal which is generated with a certain signal delay, namely with the out-decoding time $\Delta t_{DEK}$. This out-decoding time comprises a signal delay on account of the clock signal receiver, the clock signal line tree, the command decoding and on account of signal delays within the sequence controller. As the clock frequency of the external clock signal increases, the cycle time $t_{cycle}$ of the clock signal decreases. Since the time delay $\Delta t_{DEK}$ is constant, the situation arises, in the case of a clock signal at a very high frequency, in which the signal propagation time delay $\Delta t_{DEK}$ is greater than the cycle time $t_{cycle}$. In this case, the PAW control signal can no longer be received with the signal edge 1 of the VE-CLK illustrated in FIG. 4b, but rather only with the signal edge 2 of the VE-CLK clock signal. The consequence of this is that the synchronization of the internal write signal PAW to PAW' by the synchronizing circuit within the write latency generator is effected incorrectly one whole signal clock cycle later, i.e. with the signal clock cycle 2 instead of with the signal clock cycle 1. Consequently, if the clock cycle time falls into the time region of the out-decoding time on account of an excessively high clock frequency, a stable switch-on of the write data path within the S-DRAM is no longer ensured.

In order to avoid the above-demonstrated malfunction of the write latency circuit according to the prior art, it has been attempted hitherto to minimize the signal propagation times in order to reduce the delay time $\Delta t_{DEK}$. In the same way, in the prior art it is attempted to minimize the decoding time $t_{DEK}$ by optimizing the propagation and decoding times to an extent such that it remains below the time $t_{cycle}$.

In the case of reading, there is also the second error mechanism in which the offset of VECLK and DLCLK becomes greater than $t_{cyc}$. This has been solved in the prior art by optimizing the time $(t_{OCD}+t_{FIFO})$.

At very high clock frequencies, however, the minimization of the signal propagation times encounters its limits or is insufficient to prevent a malfunction.

The read latencies (CAS) depend on the quality of the production process. In this case, process fluctuations determine not only the read latency of the memory chip, but also the ability of the memory chip to operate at high clock frequencies. Therefore, all memory chips are classified into so-called speed classes after production.

FIG. 5 shows such a speed class table according to the prior art. Memory cells which are sorted into a high speed class are able to operate at a very high operating clock frequency. Such high-frequency clock frequencies mean short clock cycle times. These short clock cycle times make it impossible, however, for such memory chips to ensure a low read latency, since the internal signal delay times are likewise somewhat shorter on account of the production process, but the absolute signal delay time is less favorable in relation to the clock cycle time. In the case of very high operating clock frequencies $(t_{CLK})$ and thus very short clock cycle times $(t_{CLK})$, the signal delay times come into the region of the clock cycle time or even fall below the latter.

The table shown in FIG. 5 shows, by way of example, the speed class division for a high-performance graphics memory. In the example illustrated in FIG. 5, three different CAS latencies can be programmed into the mode register. At a CAS latency of 6, the maximum permissible operating clock frequency is 455 MHz and the associated clock cycle time is 2.2 ns. At a CAS latency of 4, the maximum clock frequency is 333 MHZ and the associated clock cycle time is 3 ns. The shorter the CAS read latency, the lower the permissible operating clock frequency and the greater the corresponding clock cycle time must be in order to avoid malfunctions.

SUMMARY OF INVENTION

The object of the present invention is to provide a control circuit for a data path of an S-DRAM which ensures a reliable functioning of the data path even in the case of a clock signal at a very high frequency.

This object is achieved according to the invention by means of a control circuit. The invention provides the control circuit for a data path of an S-DRAM which is clocked by a high-frequency clock signal, having a programmable mode register for storing a latency value; a latency generator for temporally delaying a data path control signal, generated by an internal sequence controller, with a switchable latency; a latency decoder, which switches the latency generator in a manner dependent on the latency value stored in the mode register, the control circuit according to the invention being distinguished by the fact that provision is made of at least one signal delay element, which can be switched in by the latency decoder and serves for the signal delay of the data path control signal with a specific, delay time, the latency decoder switching in the associated signal delay element if the stored latency value is high.

In this case, an associated signal delay element is preferably provided for every possible stored latency value.

The data path control signal is preferably switched through without any delay if the stored latency value is low.

The maximum permissible clock signal frequency of the clock signal for the S-DRAM preferably rises as the latency value increases.

The minimum permissible cycle time of the clock signal for the S-DRAM preferably decreases as the latency value increases.

The delay time of the delay element preferably lies between a minimum delay time (Delay$_{min}$) and a maximum delay time (Delay$_{max}$), the minimum delay time (Delay$_{min}$) being equal to the difference between the largest permissible cycle time and a control signal propagation time delay ($T_{DEK}$) of the data path control signal, and the maximum delay time (Delay$_{max}$) being equal to the difference between twice the minimum permissible cycle time and the control signal propagation time delay ($T_{DEK}$) of the data path control signal.

The signal delay elements are preferably connected in parallel to inputs of the first multiplexer, which receives a first control signal by means of the latency decoder.

The data path control signal is preferably a data enable control signal for a latency generator of the data path.

The latency generator is preferably a read latency generator or a write latency generator.

Preferably, the controllable latency generator has a plurality of series-connected time switching elements which in each case switch through a signal present at a signal input, each with the cycle time of the clock signal, with a time delay to their respective signal output.

In this case, the signal outputs of the time switching elements are preferably in each case connected to a signal input of a controllable second multiplexer within the latency generator.

The second multiplexer preferably has a control input for a second control signal output by the latency decoder.

The signal delay of all the series-connected time switching elements is preferably equal to a maximum programmable latency (CAS) minus two cycle times.

The latency decoder preferably drives the second multiplexer in the event of a low stored latency in such a way that the signal delay effected by the time switching elements is equal to the stored latency minus two clock cycle times, and the latency decoder drives the second multiplexer in the event of a high stored latency value in such a way that the signal delay effected by the time switching elements is equal to the stored latency reduced by a further cycle time.

In a preferred embodiment, the latency generator has a synchronization circuit for synchronizing the data path control signal to a clock signal which is synchronous with the external clock signal.

Preferred embodiments of the control circuit according to the invention are described below with reference to the accompanying figures in order to elucidate features that are essential to the invention.

BRIEF DESCRIPTION OF DRAWINGS

FIG. 2 shows a timing diagram of the data outputting in a conventional S-DRAM according to the prior art;

FIGS. 4a, 4b show a signal timing diagram in the case of read and write latency circuits according to the prior art.

FIG. 5 shows a speed classification of a high-performance graphics memory according to the prior art.

FIGS. 6a and 6b show a timing diagram for elucidating the method of operation of the control circuit according to the invention in comparison with the prior art.

FIGS. 9a, and 9b show read latency generators according to the invention.

DETAILED DESCRIPTION

Figure 7:
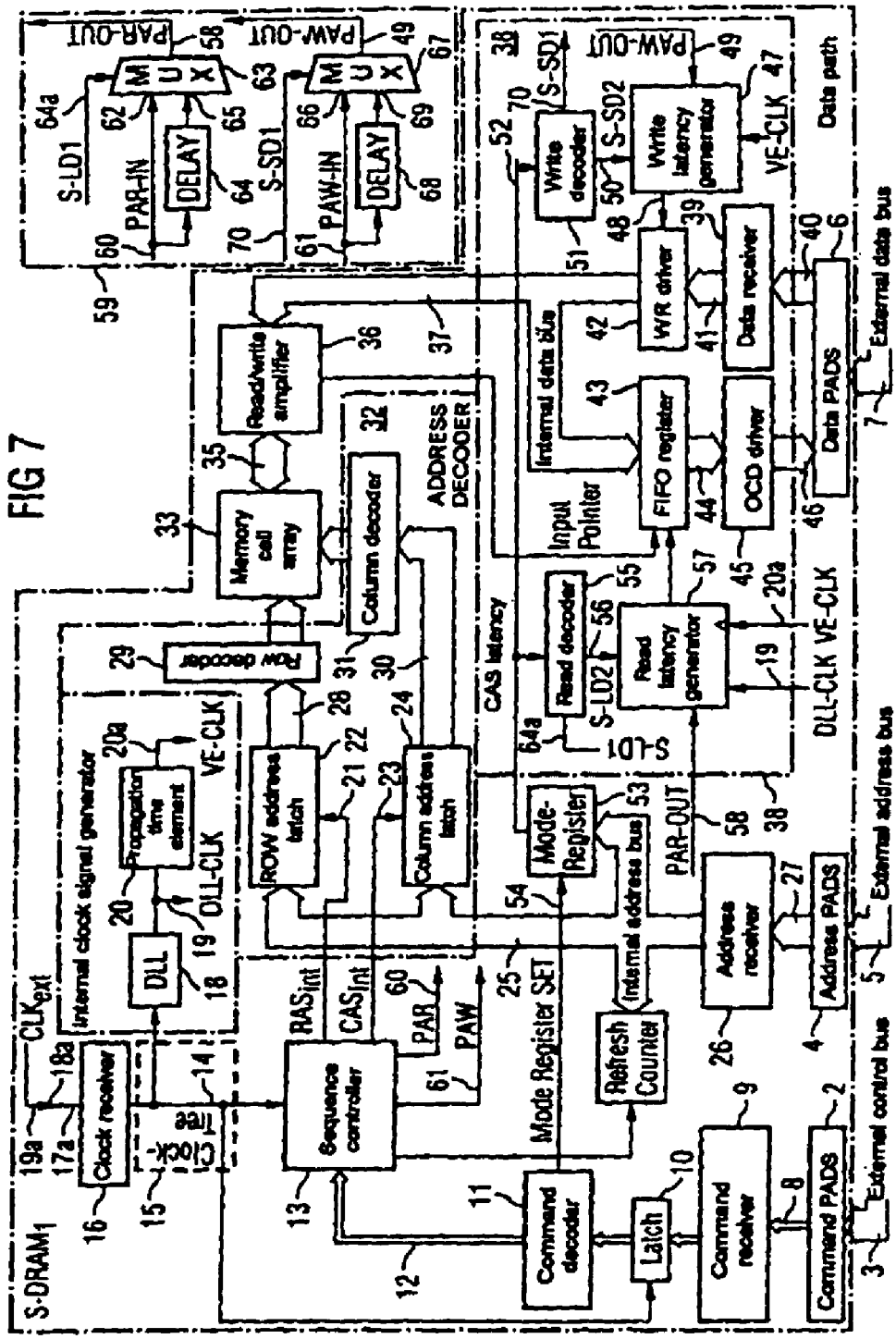
FIG. 7 shows a block diagram of an S-DRAM which contains the control circuit according to the invention.

As can be discerned from FIG. 7, the S-DRAM 1 has command PADS 2 for connection to an external control bus 3. Furthermore, the S-DRAM 1 is connected to an external address bus 5 via address PADS 4 and to an external data bus 7 via data PADS 6. Via the command PADS 2, the S-DRAM receives external control commands, which are applied to a control command receiver 9 via internal lines 8. The received external control commands are applied via internal lines 10 to a command decoder 11 for decoding. The command decoder 11 decodes the external control commands and generates internal control commands such as read (RD) and write (WR), which are output via internal control lines 12 to an integrated state machine or sequence controller 13 of the S-DRAM 1. The sequence controller 13 generates from the control commands sequence control commands for controlling the internal sequences of the S-DRAM 1. Said sequence control commands also comprise data path control signals for controlling a data path.

The sequence controller 13 receives an internal clock signal via a clock signal line 14, said clock signal being output by a clock signal receiver 16 via a clock signal line tree 15. The clock signal receiver 16 is connected via a clock line 17a to a clock signal PAD 18a for receiving an external operating clock signal CLK-external via an external clock signal line 19a. Via the clock signal line tree 15, the received external clock signal also passes to an internal clock signal generator circuit 17 within the S-DRAM 1. In a delay locked loop 18, firstly an internal clock signal DLL-CLK is generated, which has a negative phase shift with respect to the external clock signal. In this case, the negative phase shift preferably essentially corresponds to the data signal time delay of the data path. The generated internal clock signal DLL-CLK is output via an internal clock signal line 19. Connected downstream of the DLL circuit 18 is a propagation time element 20, which generates an internal clock signal VE-CLK, which is totally synchronous with the external clock signal CLK-external. The synchronous internal clock signal VE-CLK is output via a clock signal line 20a.

The internal sequence controller 13 generages an internal RAS signal which is output to a row address latch 22 via a control line 21. Furthermore, the sequence controller 13 generates an internal CAS signal which is output to a column address latch 24 via a line 23. The row address latch circuit 22 and the column address latch circuit 24 are connected to the output of an address signal receiver 26 via an internal address bus 25. Said receiver receives, via internal lines 27, the external address signal applied to the address signal PADS 4.

The row address latch circuit 22 is connected to a row decoder 29 via internal address lines 28 and the column address latch circuit 24 is connected to a column decoder 31 via internal address lines 30. The two latch circuits 22, 24 and the two decoders 29, 31 together form an address decoder 32 within the S-DRAM 1. The address decoder 32 addresses memory cells within a memory cell array 33. The memory cells are refreshed at regular time intervals by means of a refresh control command generated by the sequence controller 13.

The memory cell array 33 is furthermore connected to a read/write amplifier 36 via internal data lines 35. The read/write amplifier 36 is connected to a data path 38 within the S-DRAM 1 via an internal data bus 37. The data path 38 provides for the synchronous data transfer of data to the external data bus 7.

The data path 38 serves for writing data and for outputting data.

A data receiver 39 receives, via internal data lines 40, the external data that are to be written in at the data PADS 6. The received data pass via data lines 41 to a driver circuit 42, which is connected to the internal data bus 37 on the output side.

Conversely, the data to be output are applied to a FIFO register 43 via the internal data bus 37 and pass via data lines 44 to an output data driver 45. The output data driver 45 OCD (off chip driver) outputs the data to be output via data lines 46 to the data PADS 6.

For the synchronous writing of data, the driver circuit 42 contains an enable signal from a write latency generator 47 via a control line 48. The write latency generator 47 receives, via a control line 49, an internal write command signal PAW generated by the sequence controller 13. The write latency generator 47 is furthermore connected via lines 50 to a decoder 51, which decodes the operating mode data present on an internal control bus 52. The internal control bus 52 serves for reading out the operating mode data stored in an operating mode register 53.

The operating mode register 53 can be initialized via the internal address bus 25. For this purpose, upon receiving a corresponding external control command, the command decoder 11 generates a mode register set command which is applied to the mode register 53 via a control line 54. The mode register 53 reads in the operating mode data that are present on the internal address bus 25 at that point in time and stores them.

The internal control bus 52 is furthermore connected to a decoder 55, which decodes the operating mode data present on the internal control bus 52 and drives a read latency generator 57 via a control line 56. The read latency generator 57 receives, via a control line 58, an internal read command signal $PAR_{int}$ generated by the sequence controller 13.

The control signal lines 49, 58 for the two latency generators 47, 57 within the data path 38 are connected to a signal delay circuit 59 within the S-DRAM 1. The sequence controller 13 generates the internal control command PAW/PAR for driving the data path 38 and outputs these via internal control lines 60, 61. The sequence controller 13 is connected to the delay circuit 59 via said internal control lines 60, 61. For each data path control signal received by the sequence controller 13, the delay circuit 59 has in each case at least one signal delay element that can be switched in. In the case of the embodiment illustrated in FIG. 8, the control signal—generated by the sequence controller 13 for the read latency generator 57 passes via the internal control line 60 on the one hand to a first input 62 of a multiplexer 63 and on the other hand, in a manner time-delayed by a delay element 64, to a second input 65 of the multiplexer 63. The multiplexer 63 is driven by the read latency decoder 55 via a control line 64a.

In the same way, the control signal—generated by the sequence controller 13—for the write latency generator 47 passes via the internal control line 61 on the one hand to a first input 66 of a multiplexer 67 and on the other hand, in a manner time-delayed by a delay element 68, to a second input 69 of the multiplexer 67. The multiplexer 67 is driven by the write latency decoder 51 via a control line 70.

The data path control signal switched through by the multiplexer 63 passes via the control line 58 to the read latency generator 57 of the data path 38. The data path control signal switched through by the multiplexer 67 passes via the control line 49 to the write latency generator 47 of the data path 38.

The two decoders 51, 55 read out, via the internal data bus 52, the CAS latency programmed in the mode register 53. If the CAS latency value is low, the associated maximum clock frequency is likewise relatively low (see FIG. 5). By way of example, the maximum permissible clock frequency given a CAS latency of 4 is 333 MHz and the associated clock cycle time is 3 ns.

If the CAS latency read from the mode register 53 is low, a noncritical operating case is present, i.e. the clock cycle time ($t_{CLK}$) of the clock signal present is sufficiently high. In this case, the PAW data path control signal for the write latency generator 47 can be driven, within the first signal clock cycle, to the write latency generator 47 by the sequence controller 13. Therefore, via the control line 70, the write latency decoder 51 drives the multiplexer 67 within the signal delay circuit 59 in such a way that the multiplexer 67 switches through the first signal input 66 onto the output control line 49. In this case, no signal delay by the signal delay circuit 59 occurs. The control signal passes from the sequence controller 13 via the control line 61 and the control line 49 directly to the write latency generator 47. The control signal is therefore delayed only by the signal propagation times. These signal propagation time delays are noncritical in this case, however, since the clock cycle time ($t_{CLK}$) is sufficiently long.

If the CAS latency value read from the mode register 53 is high, however, the write decoder 51 recognizes that a critical case is present. Given a CAS latency of 6, by way of example, the operating clock frequency is 455 MHz and the associated clock cycle time is merely 2.2 ns (see FIG. 6). The clock cycle time is therefore so short that it comes into the region of the possible signal propagation time delays and malfunctions can thus occur. There is the risk of the signal propagation times being longer than the clock cycle time of the applied external clock signal, so that the data path is switched into the write mode one clock cycle too late. In this case, the write latency decoder 51 switches over from the first input 66 to the second input 69 via the control line 70 of the multiplexer 67. In this case, the control signal—output by the sequence controller 13—for the write latency generator 47 is output to the write latency generator 47 in a manner delayed by the delay element 68 with a predetermined time delay. In this case, said time delay is chosen such that the control signal lies within the second signal clock cycle after the transmission of the write command (WR). The insertion of the additional delay thus guarantees that the control signal lies within the second clock cycle after the transmission of the command. The inserted delay has been chosen such that it applies to all the permitted frequencies of the relevant CAS latency.

Through the insertion of the delay, the synchronization of PACO to PAW' is effected one clock edge later. This is compensated for again in that the read decoder 55, in the read latency generator 57, allows the PAW signal to be delayed by one clock cycle fewer.

Figure 1:
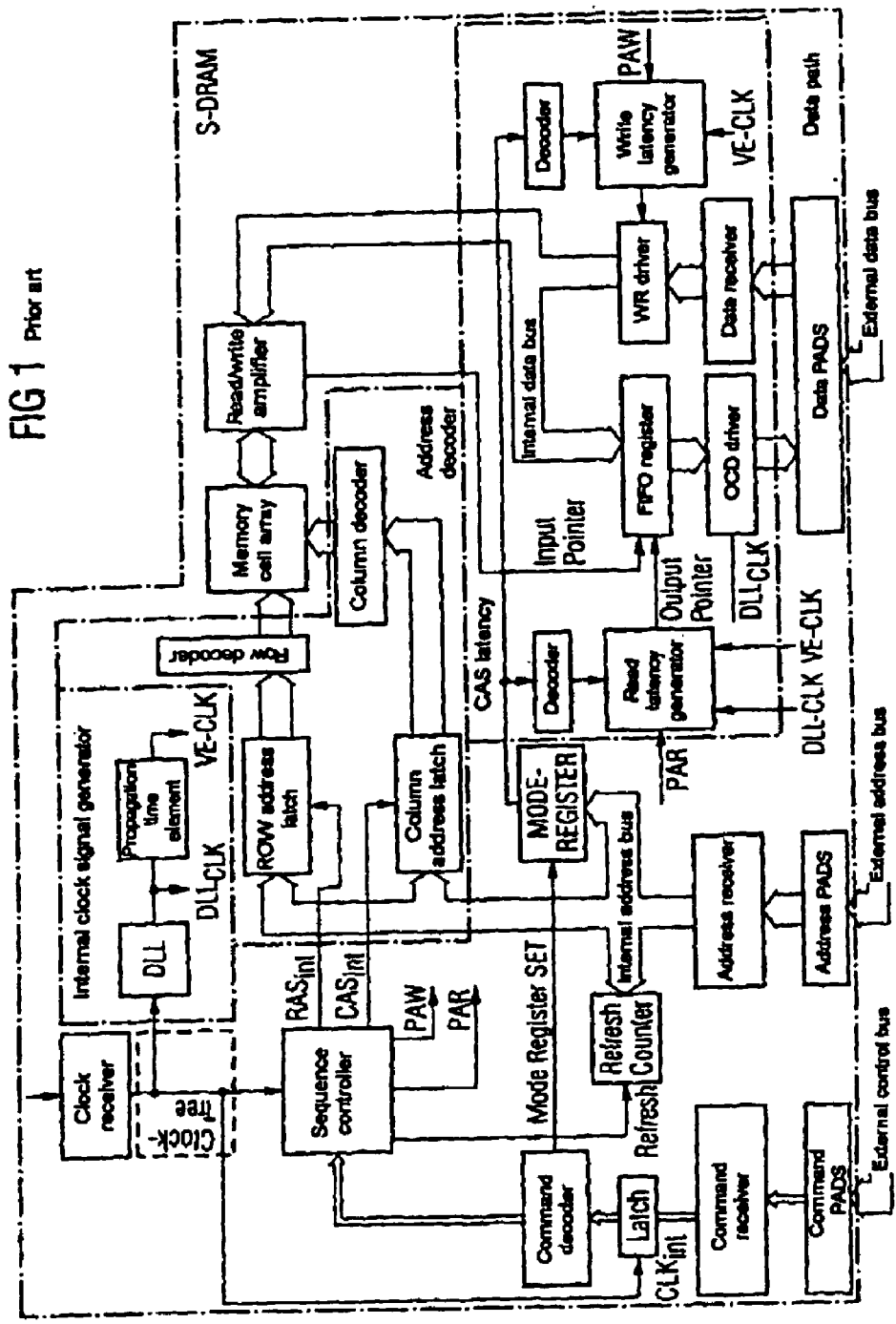
FIG. 1 shows a block diagram of a conventional S-DRAM according to the prior art.
Figure 3A:
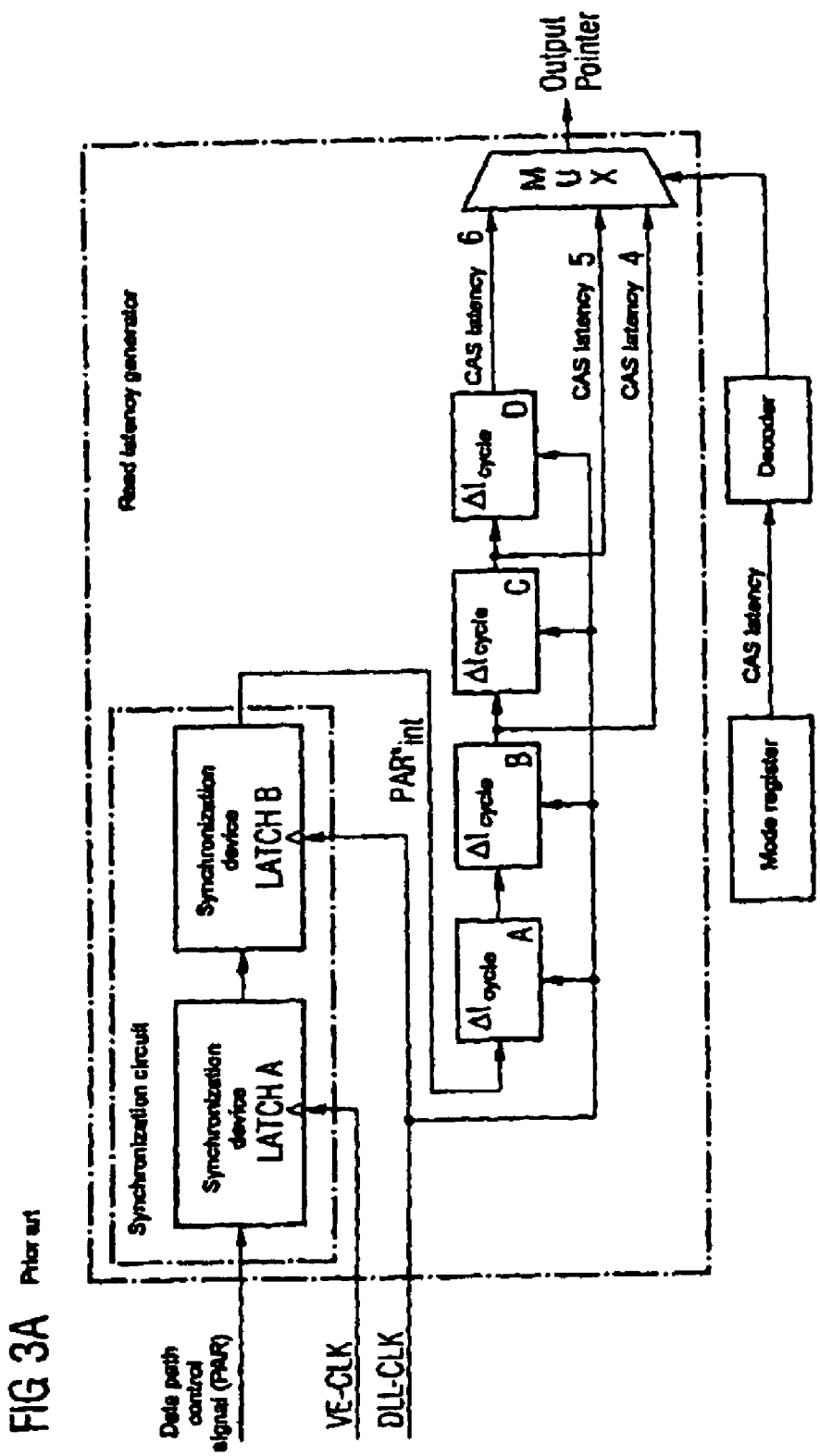
FIGS. 3a, and 3b show conventional latency generators according to the prior art.
Figure 3B:
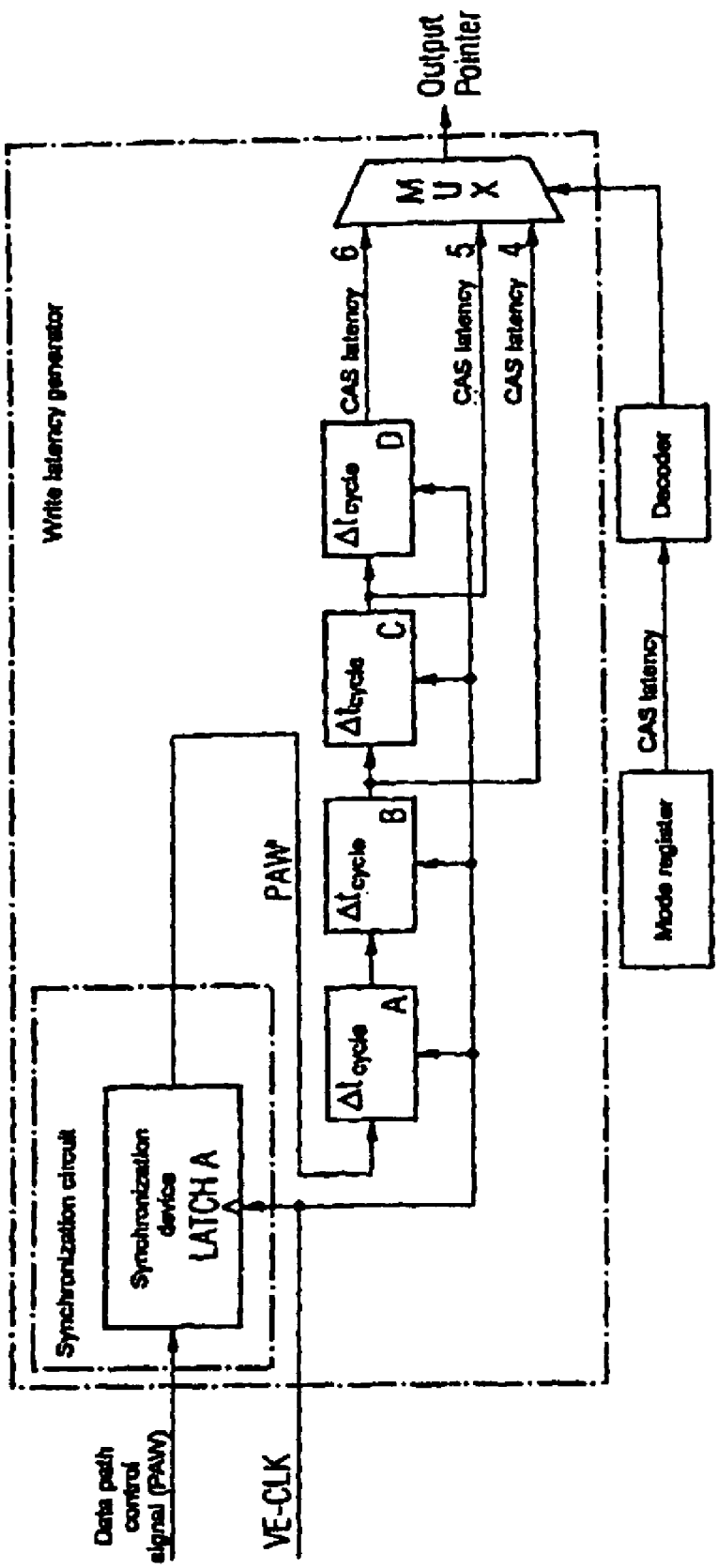
Figure 6A:
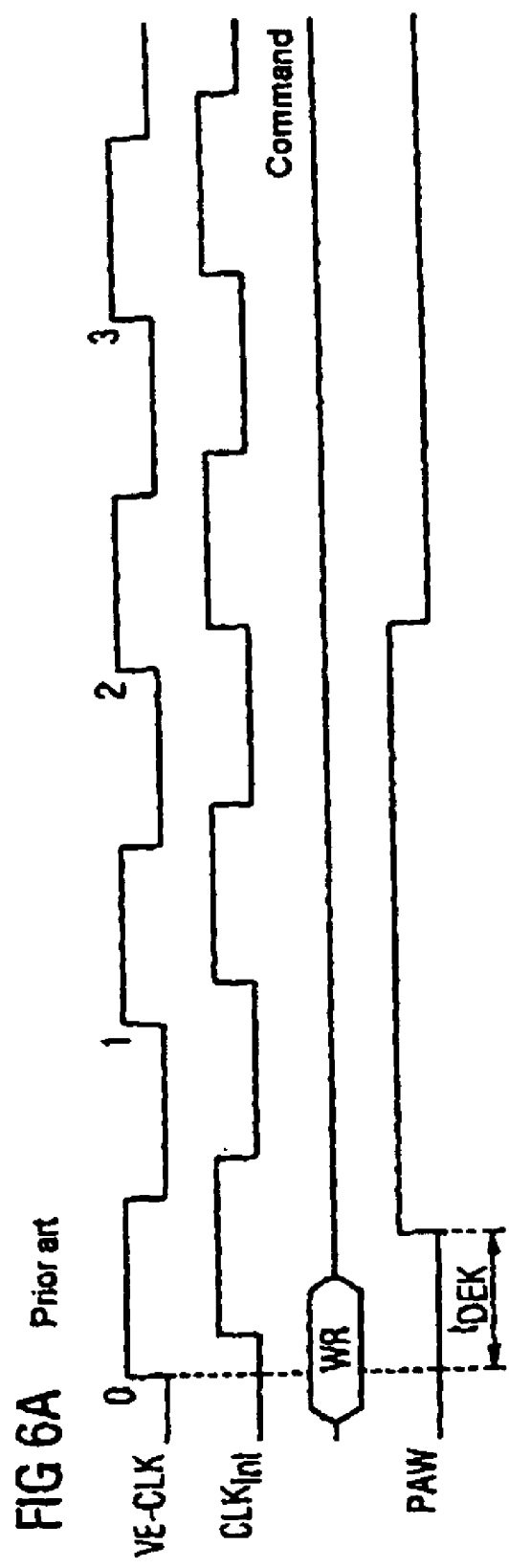

FIGS. 6a, 6b show timing diagrams when executing a write command according to the invention in comparison with the prior art. With an external clock signal, the write command (WR) is accepted. With the rising edge of the clock signal VE-CLK, the internal data path control signal (PAW)—generated by the sequence controller—for the write latency generator is driven to the write latency generator via internal control signal lines. The control signal PAW requires a certain time to pass from the sequence controller via the internal control line to the write latency generator. The data path control signal PAW requires a signal propagation time for this. The external clock signal and the internal clock signal on the chip are phase-shifted with respect to one another, the temporal offset $t_V$ between the clock signal VE-CLK and the internal clock signal $CLK_{int}$ being identical for all signal frequencies. The signal propagation time is likewise independent of the clock frequency. In the case of the clock frequency illustrated in FIG. 6, the undelayed data path control signal PAW for the write latency generator comes into the region of the clock cycle time. As a result of this, it is no longer ensured that the data path is still switched into the write mode with the k-th rising signal edge of the clock signal. This problem occurs at very high operating clock frequencies. At low operating clock frequencies, it is always ensured that the k-th edge is later, since the offset time and the signal propagation time are independent of the clock frequency. If the clock cycle time falls below the sum of offset time and signal propagation time, a stable switch-on of the write data path within the S-DRAM is no longer ensured and the control circuit according to the invention intervenes.

FIG. 6b shows the deliberately implemented signal delay $t_{delay}$. By means of the delay circuit 59, the data path control signal for the data path is output to the data path in a manner time-delayed with a specific time delay $t_{delay}$, so that the data path is switched into the write mode with the edge j. This switching-on of the data path in a manner deliberately delayed by one signal clock cycle is compensated for in circuitry terms in the write latency generator 47.

$$t_{DELAYmax} = t_{cyclemax} - t_{DEK}$$

$$t_{DELAYmin} = 2 \cdot t_{CYCLEmin} - t_{DEK}$$

Figure 8:
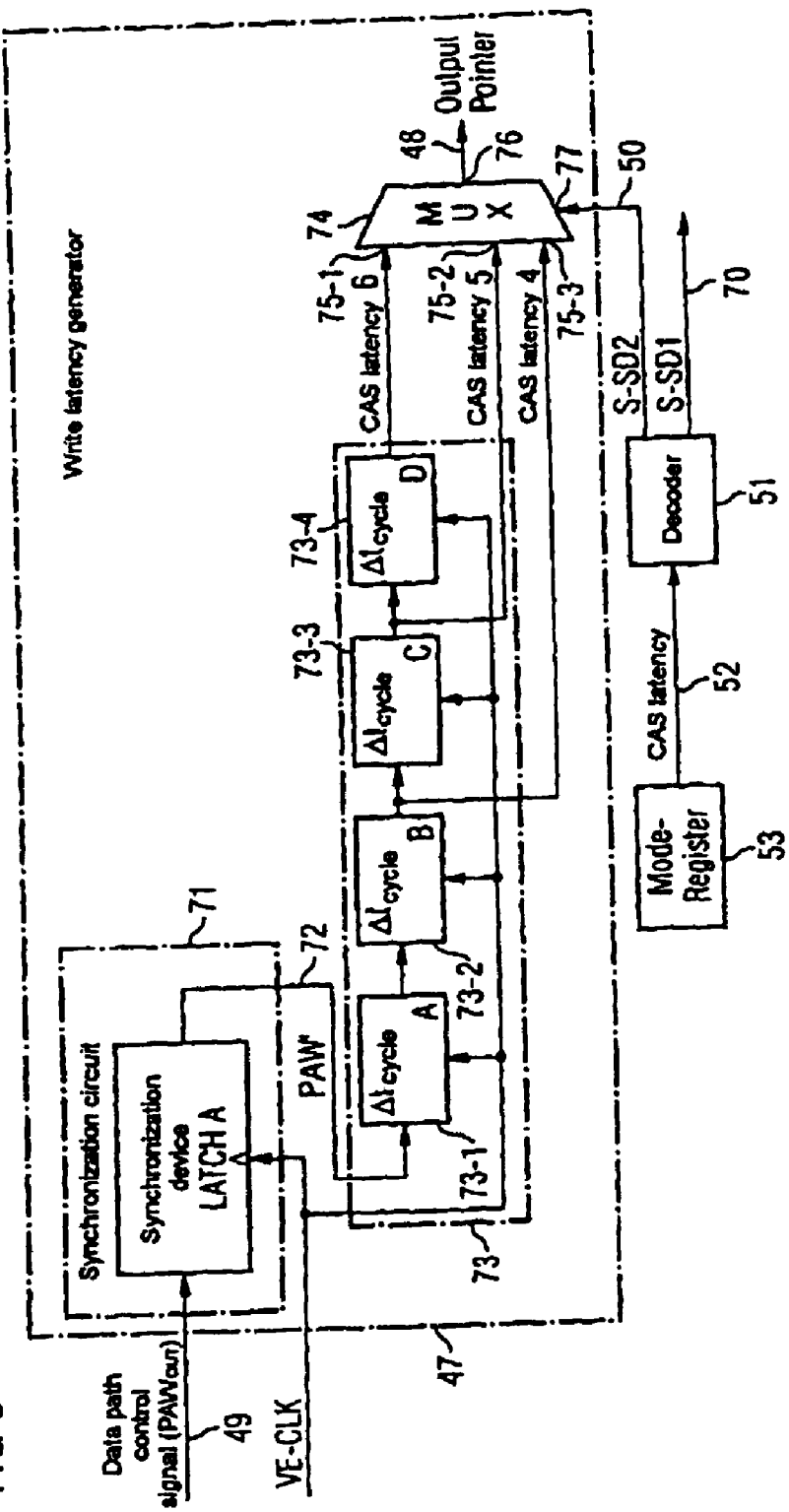
FIG. 8 shows a preferred embodiment of a write latency generator within the data path according to the invention.

FIG. 8 shows a preferred embodiment of the write latency generator 47 contained in the data path 38. The write latency generator 47 receives, via the control line 49, the data path control signal output by the delay circuit 59. The write latency generator 47 contains a synchronization circuit 71, comprising a synchronization latch for synchronization to the clock signal VE-CLK. The data path control signal synchronized by the synchronization circuit 71 is output via an internal line 72 to a delay element chain 73. In the example illustrated in FIG. 9, the delay element chain 73 comprises four clocked delay elements 73-1 to 73-5. The delay elements are clocked by the internal clock signal DLL-CLK and each carry out a signal delay by a clock cycle time $t_{cycle}$.

The write latency generator 47 contains a multiplexer 74 having a plurality of inputs 75, an output 76 and a control input 77. The signal inputs of the multiplexer are in each case connected to signal outputs of delay elements 73-$i$ within the delay element chain 73.

In the normal operating mode, i.e. if the latency read from the mode register 53 is noncritical or low (for example CAS latency 4), the synchronized data path control signal is delayed by a corresponding number of time delay elements within the chain 73. In this case, the number of delay elements through which the control signal passes is equal to the decoded latency (AS) minus two. In the example illustrated in FIG. 9, given a decoded CAS latency of 4, the decoder 51 drives the multiplexer 74 in such a way that the signal input 75-3 is switched through to the signal output 76. In this case, the synchronized data path control signal present on the internal signal line 72 is output to the driver circuit 42 by the enabled two delay elements 73-1 and 73-2 and in a manner temporally delayed by two clock cycle times.

In a critical operating case, i.e. if the read-out CAS latency is high, a signal delay of the control signal is deliberately implemented by the delay circuit 59. This switching-on of the data path into the switching mode in a manner delayed by one clock cycle is compensated for by driving the multiplexer 74 within the write latency generator 47. By way of example, if the read-out CAS latency is 6 and if a critical operating case is thus present in which the clock cycle time is merely 2.2 ns (see FIG. 5), the write latency decoder 51 drives the multiplexer 67 via the control line 70 in such a way that a signal delay of the data path control signal is effected by the delay element 68. At the same time, the write latency decoder 51 outputs, via the control line 50, a control signal to the control input 77 of the multiplexer 74, so that a switch-over from the input 75-1 to the input 75-2 is effected. The control signal is thus tapped off one delay element previously and, in this case, no longer passes through the last delay element 73-5 within the chain 73. For low CAS latency values, for example CAS latency value 4, compensation does not have to be effected since the delay circuit 59 in this case outputs the data path control signal command to the data path 38 without any delay.

The control circuit according to the invention makes it possible to control the data path 38 stably even at very high clock frequencies and to avoid malfunctions in the process. In this case, recourse is had to the speed classifications already prescribed for S-DRAMs. Defined signal delay in the control signal path ensures a reliable switch-on of the read/write mode of the data path 38.

In the embodiment of the control circuit according to the invention as illustrated in FIG. 8, only one delay element 64 or 68 is provided for each data path control signal. In this embodiment, the write latency decoder 51 merely distinguishes whether the latency value read from the mode register 53 is high and thus a critical operating case is or is not present. In the critical operating case, the multiplexer 67 is switched over to the second input 69, so that a temporal delay is effected by the delay element 68.

In an alternative embodiment of the delay circuit 59, a plurality of delay elements are connected in parallel, a dedicated delay element preferably being provided for every possible latency value. The higher the CAS latency value read from the mode register 53, i.e. the higher the operating clock frequency and the shorter the clock cycle time, the longer the signal delay implemented by the delay circuit 59 becomes, this being achieved by switching over to a delay element with a correspondingly longer delay time.

The delay time achieved by the delay elements preferably lies between a minimum delay time ($Delay_{min}$) and a maximum delay time ($Delay_{max}$). In this case, the minimum delay time ($Delay_{min}$) is equal to the difference between the largest minimum permissible cycle time ($t_{Ckmax}$) and the control signal propagation time delay ($\Delta t$) of the data path control signal.

The maximum delay time of the delay element ($Delay_{max}$), which [sic] preferably equal to the difference between twice the minimum permissible cycle time ($2 \cdot t_{Ckmin}$) and the control signal propagation time delay ($\Delta t$) of the data path control signal.

$$Delay_{max} = (2 \cdot t_{Ckmin}) - \Delta t$$

$$Delay_{min} = t_{Ckmax} - \Delta t$$

The delay time of the delay element 68 is preferably chosen as mean value between the maximum delay time ($Delay_{max}$) and the minimum delay time ($Delay_{min}$).

Figure 9B:
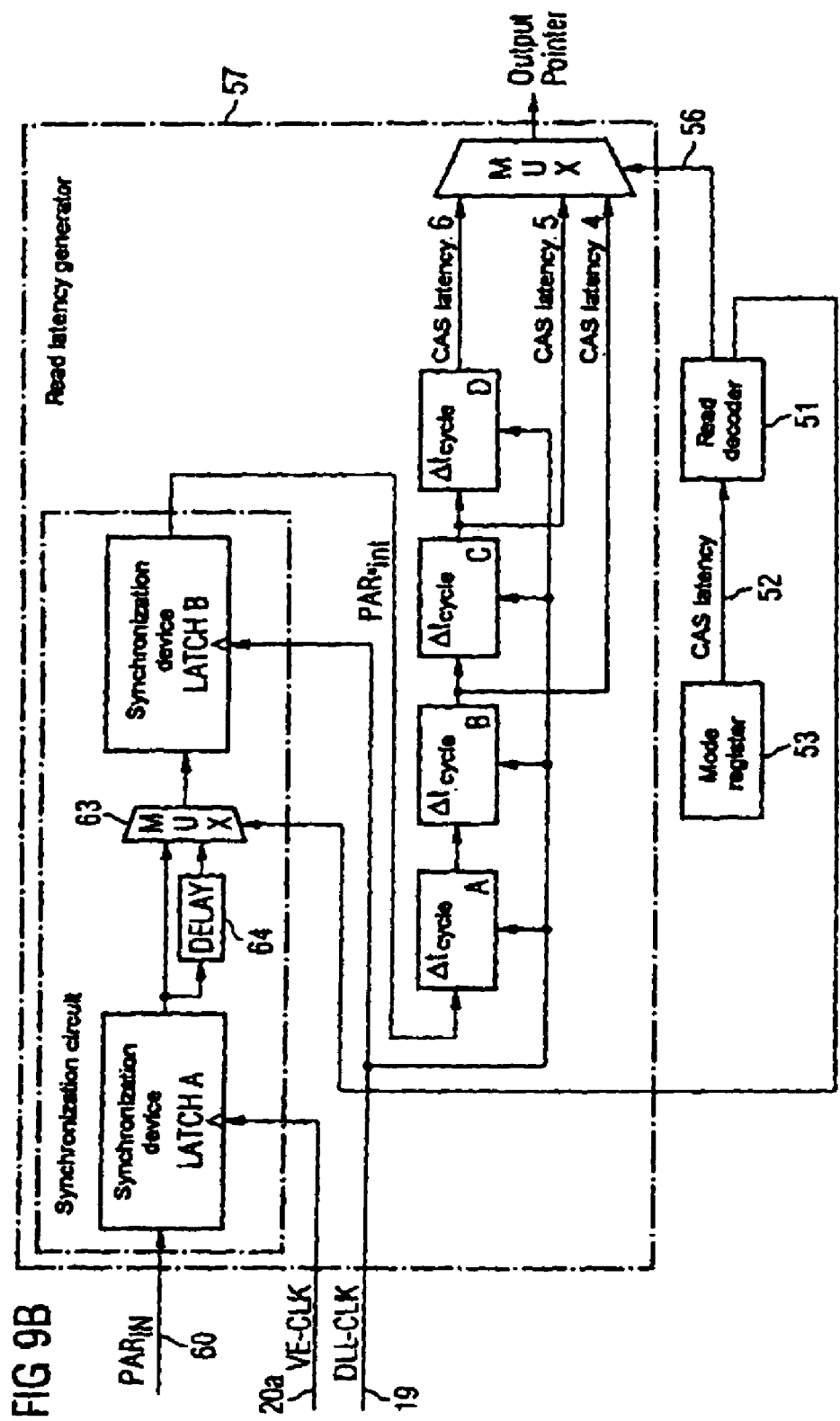

FIGS. 9a, 9b exhibit two different embodiments for the read latency generator 57 according to the invention. FIG. 9a shows the read latency generator 57 for the case where $C_{DEK}$ is greater than $t_{CYCLE}$.

FIG. 9b shows an alternative embodiment of the read latency generator 57 for the case where $t_{FIFO} + t_{OCD}$ is greater than $t_{CYCLE}$.

Depending on which of the two problems are to be solved, either the read latency generator according to FIG. 9a or the read latency generator according to FIG. 9b can be integrated on the S-DRAM 1. In the read latency generator 57 illustrated in FIG. 9a, the multiplexer 63 is situated in the delay circuit 59, as illustrated in FIG. 7. In the read latency generator 57 in accordance with the embodiment illustrated in FIG. 9b, the multiplexer 63 is situated in the synchronization circuit within the read latency generator 57.

What is claimed is:

1. A control circuit for a data path of an S-DRAM which is clocked by a clock signal, the control circuit comprising:
   a programmable mode register for storing a latency value;
   a latency generator for temporally delaying, with a switchable latency, a data path control signal, generated by an internal sequence controller;
   a latency decoder which is functionally connected to and switches the latency generator in a manner dependent on the latency value stored in the mode register; and at least one signal delay element, which is operable to be switched in by the latency decoder to cause a signal delay of a specific delay time in the data path control signal so that the latency decoder switches in the at least one signal delay element when the stored latency value is a high latency value such that there is a risk of signal propagation times being longer than a cycle time of the clock signal if the signal delay were not present, and wherein the latency decoder otherwise switches out the at least one signal delay element.

2. The control circuit according to claim 1 wherein a maximum clock signal frequency of the clock signal rises as the latency value increases.

3. The control circuit according to claim 2 wherein the specific delay time lies between a minimum delay time and a maximum delay time, the minimum delay time being equal to a difference between the largest minimum permissible clock cycle time and a control signal propagation time delay of the data path control signal, and the maximum delay time being equal to the difference between twice the minimum permissible clock cycle time and a control signal propagation time delay for the data path control signal.

4. The control circuit of claim 1 wherein the latency generator further comprises a controllable first multiplexer having a control input connected to the latency decoder.

5. The control circuit according to claim 1 where the at least one signal delay element comprises a plurality of signal delay elements, each of the plurality of signal delay elements associated with a stored latency value.

6. The control circuit according to claim 4 wherein the at least one signal delay element further comprises a plurality of signal delay elements, each of the plurality of signal delay elements associated with a stored latency value.

7. The control circuit according to claim 1 wherein the data path control signal is a data enable control signal for the latency generator.

8. The control circuit according to claim 6 wherein the data path control signal is a data enable control signal for the latency generator.

9. The control circuit according to claim 7 wherein the latency generator is a write latency generator.

10. The control circuit according to claim 8 wherein the latency generator is a write latency generator.

11. The control circuit according to claim 1 wherein the latency generator further comprises a plurality of series-connected time switching elements which in each case switch through a signal present at a signal input, with a time delay to their signal output.

12. The control circuit according to claim 5 wherein the latency generator further comprises a plurality of series-connected time switching elements which in each case switch through a signal present at a signal input, with a time delay to their signal output.

13. The control circuit according to claim 10 wherein the latency generator further comprises a plurality of series-connected time switching elements which in each case switch through a signal present at a signal input, with a time delay to their signal output.

14. The control circuit according to claim 11, further comprising a controllable second multiplexer within the latency generator connected to at least some of the signal outputs of the time switching elements.

15. The control circuit according to claim 12, further comprising a controllable second multiplexer within the latency generator connected to at least some of the signal outputs of the time switching elements.

16. The control circuit according to claim 13, further comprising a controllable second multiplexer within the latency generator connected to at least some of the signal outputs of the time switching elements.

17. The control circuit according to claim 14, wherein the controllable second multiplexer has a control input for a second control signal output of the latency decoder.

18. The control circuit according to claim 15 wherein the controllable second multiplexer has a control input for a second control signal output of the latency decoder.

19. The control circuit according to claim 16 wherein the controllable second multiplexer has a control input for a second control signal output of the latency decoder.

20. The control circuit according to claim 11 wherein the signal delay of all the series-connected time switching elements is equal to a maximum programmable latency minus two.

21. The control circuit according to claim 14 wherein the signal delay of all the series-connected time switching elements is equal to a maximum programmable latency minus two.

22. The control circuit according to claim 17 wherein the signal delay of all the series-connected time switching elements is equal to a maximum programmable latency minus two.

23. The control circuit according to claim 14 wherein the latency decoder drives the controllable second multiplexer in the event of a low stored latency value in such a way that the signal delay effected by the time switching elements is equal to the stored latency minus two clock cycle times, and wherein the latency decoder drives the controllable second multiplexer in the event of a high stored latency value in such a way that the signal delay effected by the time switching elements is equal to the stored latency reduced by a further clock cycle time, and wherein the low latency value is a value such that there is no risk of signal propagation times being longer than a cycle time of the clock signal if the signal delay were not present, and the high latency value is a value such that there is a risk of signal propagation times being longer than a cycle time of the clock signal if the signal delay were not present.

24. The control circuit according to claim 1 wherein the latency generator has a synchronization circuit for synchronizing the data path control signal to the clock signal.

25. The control circuit according to claim 3 wherein the latency generator has a synchronization circuit for synchronizing the data path control signal to the clock signal.

26. The control circuit according to claim 6 wherein the latency generator has a synchronization circuit for synchronizing the data path control signal to the clock signal.

27. The control circuit according to claim 11 wherein the latency generator has a synchronization circuit for synchronizing the data path control signal to the clock signal.

28. A method of controlling an S-DRAM which is clocked by a clock signal, the method comprising:

storing a latency value in a programmable mode register;

decoding the latency value;

temporally delaying a data path control signal through use of a latency generator in a manner dependent on the latency value; and switching in at least one signal delay element to cause a signal delay in the data path control signal when the stored latency value is high enough so that there is a risk of signal propagation times being longer than a cycle time of the clock signal if the signal delay were not present, and otherwise switching out the at least one signal delay element.

29. The method of claim 28 wherein a specific delay time lies between a minimum delay time and a maximum delay time, the minimum delay time being equal to a difference between the largest minimum permissible clock cycle time and a control signal propagation time delay of the data path control signal, and the maximum delay time being equal to the difference between twice the minimum permissible clock cycle time and a control signal propagation time delay for the data path control signal.

30. The method of claim 28 wherein the data path control signal is a data enable control signal for the latency generator.

31. The method of claim 29 wherein hat the data path control signal is a data enable control signal for the latency generator.

* * * * *